(12) United States Patent
Ronen

(10) Patent No.: US 7,325,090 B2
(45) Date of Patent: Jan. 29, 2008

(54) REFRESHING DATA STORED IN A FLASH MEMORY

(75) Inventor: Amir Ronen, Ramat Hasharon (IL)

(73) Assignee: Sandisk IL Ltd., Kfar Saba (IL)

( * ) Notice: Subject to any disclaimer, the term of this patent is extended or adjusted under 35 U.S.C. 154(b) by 0 days.

(21) Appl. No.: 10/973,272

(22) Filed: Oct. 27, 2004

(65) Prior Publication Data

US 2005/0243626 A1 Nov. 3, 2005

Related U.S. Application Data

(60) Provisional application No. 60/566,840, filed on Apr. 29, 2004.

(51) Int. Cl.
*G06F 12/00* (2006.01)

(52) U.S. Cl. .................... 711/106; 711/103
(58) Field of Classification Search .............. None
See application file for complete search history.

(56) References Cited

U.S. PATENT DOCUMENTS

| | | | | |
|---|---|---|---|---|
| 4,977,537 A | * | 12/1990 | Dias et al. | 711/106 |
| 5,365,486 A | * | 11/1994 | Schreck | 365/185.22 |
| 5,404,485 A | | 4/1995 | Ban | 711/202 |
| 5,511,020 A | * | 4/1996 | Hu et al. | 365/185.28 |
| 5,625,791 A | * | 4/1997 | Farrugia et al. | 711/106 |
| 5,724,285 A | * | 3/1998 | Shinohara | 365/185.25 |
| 5,909,449 A | * | 6/1999 | So et al. | 714/721 |
| 6,240,032 B1 | * | 5/2001 | Fukumoto | 365/222 |
| 6,522,586 B2 | * | 2/2003 | Wong | 365/185.25 |
| 6,738,861 B2 | * | 5/2004 | Lawrence | 711/106 |
| 6,751,127 B1 | * | 6/2004 | Chou et al. | 365/185.25 |
| 6,754,128 B2 | * | 6/2004 | Wong | 365/222 |
| 6,763,424 B2 | | 7/2004 | Conley | 711/103 |
| 6,841,821 B2 | * | 1/2005 | Hsu | 257/305 |
| 6,856,568 B1 | * | 2/2005 | Wong | 365/222 |
| 6,898,117 B2 | * | 5/2005 | So et al. | 365/185.03 |
| 6,931,480 B2 | * | 8/2005 | Swaminathan | 711/103 |
| 2001/0002172 A1 | * | 5/2001 | Tanaka et al. | 365/185.22 |
| 2002/0004882 A1 | * | 1/2002 | Kai et al. | 711/106 |
| 2003/0021149 A1 | * | 1/2003 | So et al. | 365/185.03 |
| 2003/0046487 A1 | * | 3/2003 | Swaminathan | 711/106 |
| 2003/0147277 A1 | * | 8/2003 | Hsu | 365/185.01 |
| 2005/0013169 A1 | * | 1/2005 | Tanaka et al. | 365/185.22 |

* cited by examiner

*Primary Examiner*—Brian R. Peugh
(74) *Attorney, Agent, or Firm*—Mark M. Friedman

(57) ABSTRACT

Data are stored in one or more cells of a non-volatile memory, and are refreshed according to a predetermined condition. The data are refreshed either in-place or out-of-place. The condition may be related to the age of the data. Alternatively, the data are refreshed periodically, or when the system that includes the memory boots or dismounts, or according to the type of the data.

7 Claims, 4 Drawing Sheets

REFRESHING DATA STORED IN A FLASH MEMORY

This is a continuation-in-part of U.S. Provisional Patent Application No. 60/566,840, filed Apr. 29, 2004.

FIELD AND BACKGROUND OF THE INVENTION

The present invention relates to the management of non-volatile memories and, more particularly, to a method of managing a memory such as a flash memory that has a finite data retention time span.

FIG. 1 illustrates the storage of a bit, either a zero bit or a one bit, in a cell of an electrically programmable memory (EPROM) such as a flash memory. For historical reasons, this process of storing data in a EPROM is called "programming" the EPROM. Specifically, the cell that is the subject of FIG. 1 stores one bit of data, and so commonly is called a single-level cell (SLC). Initially, the cell has a nominal threshold voltage $V_1$, that represents a one bit. For example, after a block of a flash memory has been erased, all the cells have nominal threshold voltages $V_1$. Because of unavoidable inaccuracies in the initializations of the cells, the actual threshold voltages are distributed around the nominal threshold voltage $V_1$ according to a distribution curve 10. Then, to each cell that is to store a zero bit, a train of programming voltage pulses is applied, in order to inject electrons from the cell's silicon substrate through the cell's oxide layer into the cell's floating gate, until the cell's threshold voltage exceeds a reference voltage $V_0$ that represents a zero bit. Because the electrons move through the oxide layer by quantum mechanical tunneling or by hot injection, because of non-uniformities in the cells' structures, and because the initial threshold voltages are distributed according to distribution curve 10, the threshold voltages of the cells that store zero bits are distributed above $V_0$ according to a distribution curve 12.

A cell is read by comparing the cell's threshold voltage to a reference voltage $V_R$ that is above distribution curve 10 but below $V_0$. If the cell's threshold voltage is below $V_R$ then the cell's contents are read as a one bit. If the cell's threshold voltage is at or above $V_R$ then the cell's contents are read as a zero bit.

Over time, the threshold voltages of the cells that store zero bits tend to drift downwards. Also shown in FIG. 1, in phantom, is a distribution curve 14 that represents the distribution of the threshold voltages of the cells that have been programmed to store zero bits after the passage of a considerable amount of time. $V_1$, $V_R$ and $V_0$ are selected to be sufficiently far apart to preserve the reliability of the flash memory despite this drift of the threshold voltages.

One goal of the designers of flash memories is to reduce the cost per bit of storing data. This is accomplished in two ways. The first way is to use fabrication processes that cram more cells into the same semiconductor area. The second way is to use multi-level cells (MLCs) that store more than one bit per cell. Both ways of reducing costs decrease the retention time of the data. For example, multiple bits are stored in a MLC by defining $2^n$ voltage bands, to store n bits, in place of the two voltage bands (above and below $V_R$) of a SLC. Because the voltage bands of a MLC are necessarily narrower than the voltage bands of a comparable SLC, the threshold voltage of a MLC that has been programmed to store one or more zero bits drifts down to the next band down sooner than the threshold voltage of a comparable SLC drifts below $V_R$.

There is thus a widely recognized need for, and it would be highly advantageous to have, a method of managing a non-volatile memory such as a flash memory to increase the memory's data retention time.

SUMMARY OF THE INVENTION

According to the present invention there is provided a method of managing a memory, including the steps of: (a) storing data in at least one cell of the memory; and (b) refreshing the data that are stored in the at least one cell, according to a predetermined condition.

According to the present invention there is provided a memory device including: (a) at least one cell; and (b) a controller operative: (i) to store data in the at least one cell, and (ii) to refresh the data according to a predetermined condition.

According to the present invention there is provided a system for storing data, including: (a) a memory device that includes: at least one cell; and (b) a processor operative: (i) to store the data in the at least one cell, and (ii) to refresh the data according to a predetermined condition.

Although the description herein is directed at flash memories, the scope of the present invention includes any non-volatile memory that has a finite data retention time. The general idea of the present invention is to treat the memory as a semi-volatile memory. The data that are stored in the cells of the memory are refreshed according to a predetermined condition.

Preferably, the storing of the data is effected at a storage date, and the condition includes the storage date. More preferably, the condition is that a predetermined time interval has elapsed since the storage date. Most preferably, a timestamp is recorded that is indicative of the storage date and the condition is tested by comparing the timestamp to the clock of the system that includes the memory.

Alternatively, the condition is the occurrence of one of a plurality of predetermined refresh dates. Most preferably, there are three or more refresh dates, spaced evenly or spaced with monotonically decreasing spacing.

Alternatively, the condition is that the system that includes the memory boots.

Alternatively, the condition is that the system that includes the memory dismounts.

Alternatively, the condition is related to the type of data being stored.

Alternatively, the data stored in different partitions of the memory have different respective refresh conditions.

Preferably, the data are refreshed in-place. Alternatively, the data are refreshed out-of-place.

A memory device of the present invention includes at least one memory cell and a controller that stores data in the at least one cell and that refreshes the data according to a predetermined condition.

A data storage system of the present invention includes a memory device with at least one memory cell and a processor that stores the data in the at least one cell and that refreshes the data according to a predetermined condition.

Conley, in U.S. Pat. No. 6,763,424, in writing data to a page of a flash memory, also writes a timestamp to that page. However, Conley's purpose in using a timestamp is totally different from the purpose of the timestamp of the present invention. Conley uses timestamps to determine the order in which data were written, to avoid copying data that need not be updated when only some of the data stored in a block of pages are updated. If two pages, one in the old block and the other in the new block, share a common logical address, then data are read from the page that was most recently written.

BRIEF DESCRIPTION OF THE DRAWINGS

The invention is herein described, by way of example only, with reference to the accompanying drawings, wherein.

DESCRIPTION OF THE PREFERRED EMBODIMENTS

Figure 1:
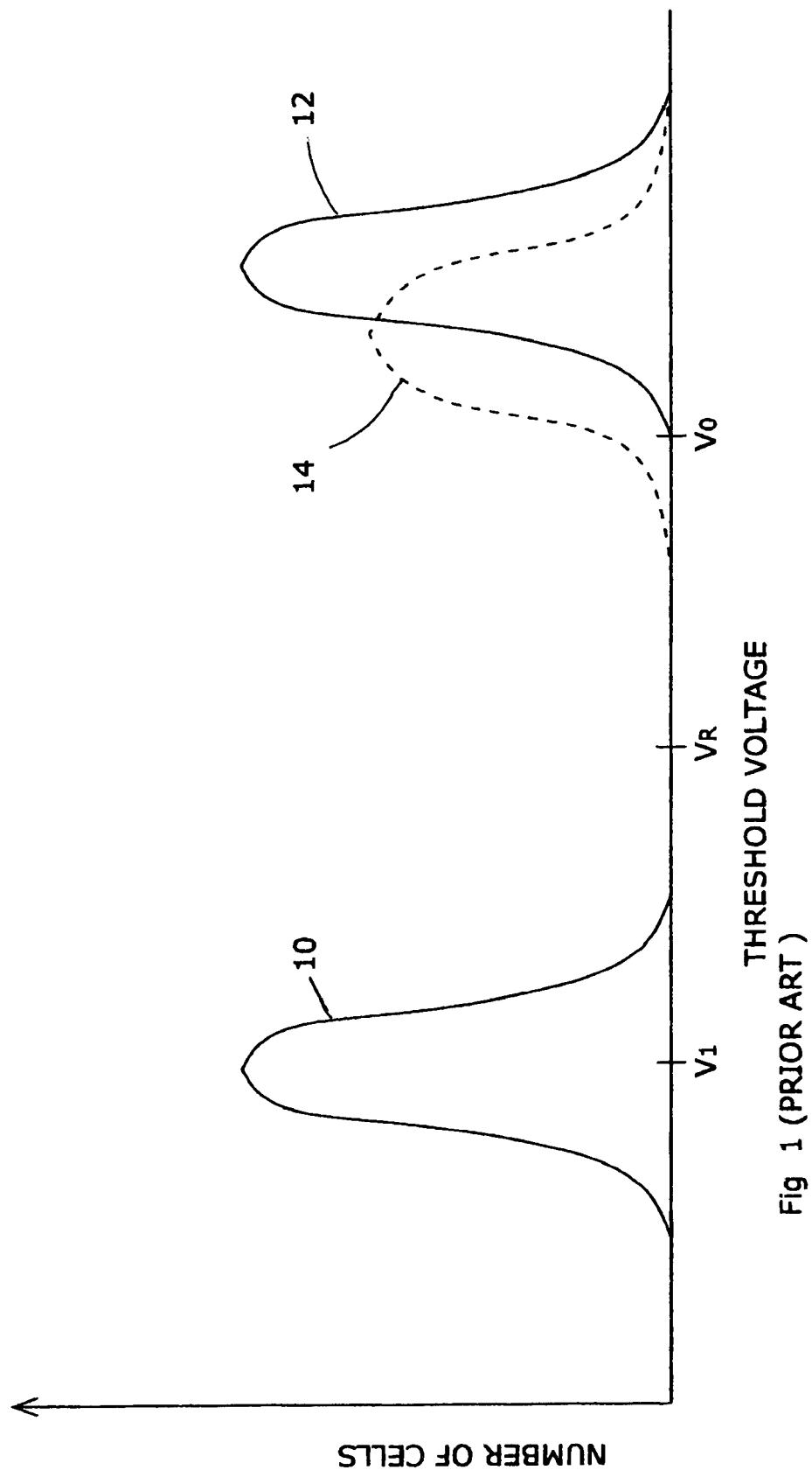
FIG. 1 illustrates the storage of a bit in a SLC flash cell.

The present invention is of a method of managing a nominally non-volatile memory to increase the data retention time of the memory.

The principles and operation of non-volatile memory management according to the present invention may be better understood with reference to the drawings and the accompanying description.

The general idea of the present invention is to refresh the data that are stored in the memory. "Refreshing" the data means storing the data in the way that they were originally stored, either by restoring the cells in which the data are stored to the condition these cells were in when they were first programmed to store the data that they currently store or by reprogramming the memory with the data.

In the case of a flash memory that has restrictions, for example restrictions on partial page programming or restrictions on non-sequential page writing, that prevent the application of more programming voltage pulses to cells that have already been programmed, there are two options for refreshing the data. The first option is to copy the data to a different location, for example to a volatile memory or to another EPROM, to erase the cells whose data are being refreshed, and to reprogram the newly erased cells with the copied data. The second option is to copy the data from the cells that initially were programmed with the data to a new set of cells. If necessary, in the case of a flash memory, one or more blocks are erased to accommodate the data. The first option is an example of an in-place method of refreshing data, because the data end up stored in the cells in which they originally were stored. The second option is an example of an out-of-place method of refreshing data.

The number of cells whose data are refreshed in a single pass is whatever number is convenient. For example, in the case of a flash memory, the data may be refreshed one cell at a time, one read unit (a byte in the case of NOR flash memories; a page in the case of NAND flash memories) at a time, one programming unit (page) at a time, or one erase unit (block) at a time.

When to refresh data is determined according to a predetermined condition. One preferred condition is according to the age of the data: data that are sufficiently old to warrant being refreshed are refreshed. To facilitate the use of this condition, the data are stored along with a time stamp of the date on which they were programmed. This date is termed herein the "storage date" of the data. The data are refreshed when the current date, as determined by the system clock of the system that includes the memory, exceeds the data's storage date by a predetermined age. In a NAND flash memory in which the data are refreshed one page at a time, each page of data has its own time stamp that is most conveniently stored in the page's so called "spare area" or "extra area", an area that conventionally is used to store flash management data such as error correction bits. Following the refreshing of the data, the date on which the data were refreshed is stored in the spare area as a new time stamp. Note that when the data of a page are refreshed, the data in the spare area (other than the storage date) also are refreshed. If the unit whose data are refreshed together is larger than one page, for example if the data are refreshed one erase block at a time, then the time stamp is stored in the spare area of the first page of the unit.

The precision (year only, year and month, year and date, etc.) with which the storage date is stored in a time stamp is a design option. Note that there is a tradeoff between the precision of the storage date and the number of cells needed to store the storage date. Time stamp storage size is minimized by, for example, storing the storage date modulo a predetermined number or storing only a checksum of the storage date.

Figure 4:
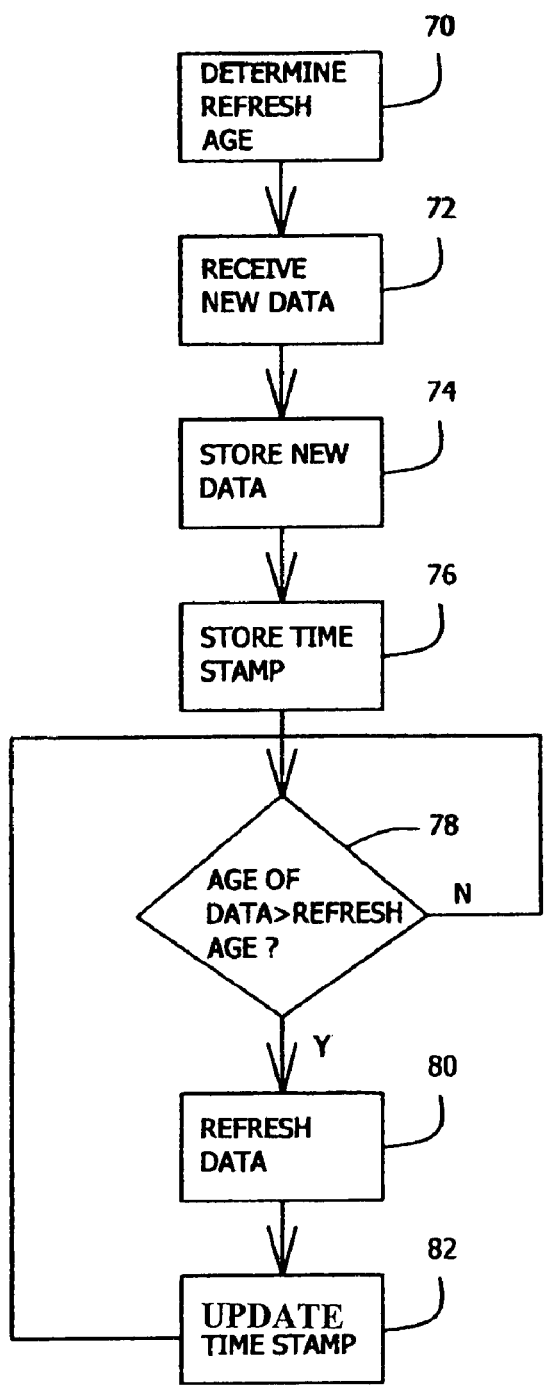
FIG. 4 is a flow chart of age-based data refresh according to the present invention.

Referring again to the drawings, FIG. 4 is a flow chart of data refresh according to the age of the data. In block 70, the age at which data are to be refreshed is predetermined. In block 72, new data to store are received. In block 74, the new data are stored. In block 76, a time stamp of the date of data storage is stored. Periodically, and depending on the precision of the time stamp, the age of the data, as determined by subtracting the time stamp from the current date, is compared to the predetermined refresh age in block 78. If the age of the data exceeds the refresh age, then the data are refreshed in block 80 and the time stamp is updated in block 82.

Those skilled in the art will readily imagine other conditions for refreshing data. For example, data may be refreshed periodically, at equally spaced dates or at dates with gradually decreasing spacing (to compensate for degradation in data retention as the memory ages), independent of the data's storage date. These period dates are termed "refresh dates" herein. Data may be refreshed whenever the system that includes the memory boots, or whenever the system that includes the memory dismounts. Data refresh conditions may be "mixed and matched". For example, only pages older than a predefined threshold age may be refreshed when the system that includes the memory boots.

The condition for refreshing the data may depend on the type of the data. For example, the refresh condition of multimedia data, such as MP3 songs or MPEG4 video clips, may be different than the refresh condition of critical code, with the critical code being refreshed more often than the multimedia data. In a memory with multiple partitions, each partition may have its own refresh condition. For example, the data of the boot code partition may be refreshed more often than the data of the multimedia partition.

In general, there is a tradeoff between the frequency of refreshing data and the durability of the memory. For example, a flash memory can endure only a finite number of erase cycles. The data refresh policy selected for a flash memory should take into account this property of flash memories. Here, too, the refresh condition may depend on the type of data being refreshed. For example, code that is programmed once and then is never or rarely changed can endure more refresh cycles than user data that are changed frequently.

Figure 2:
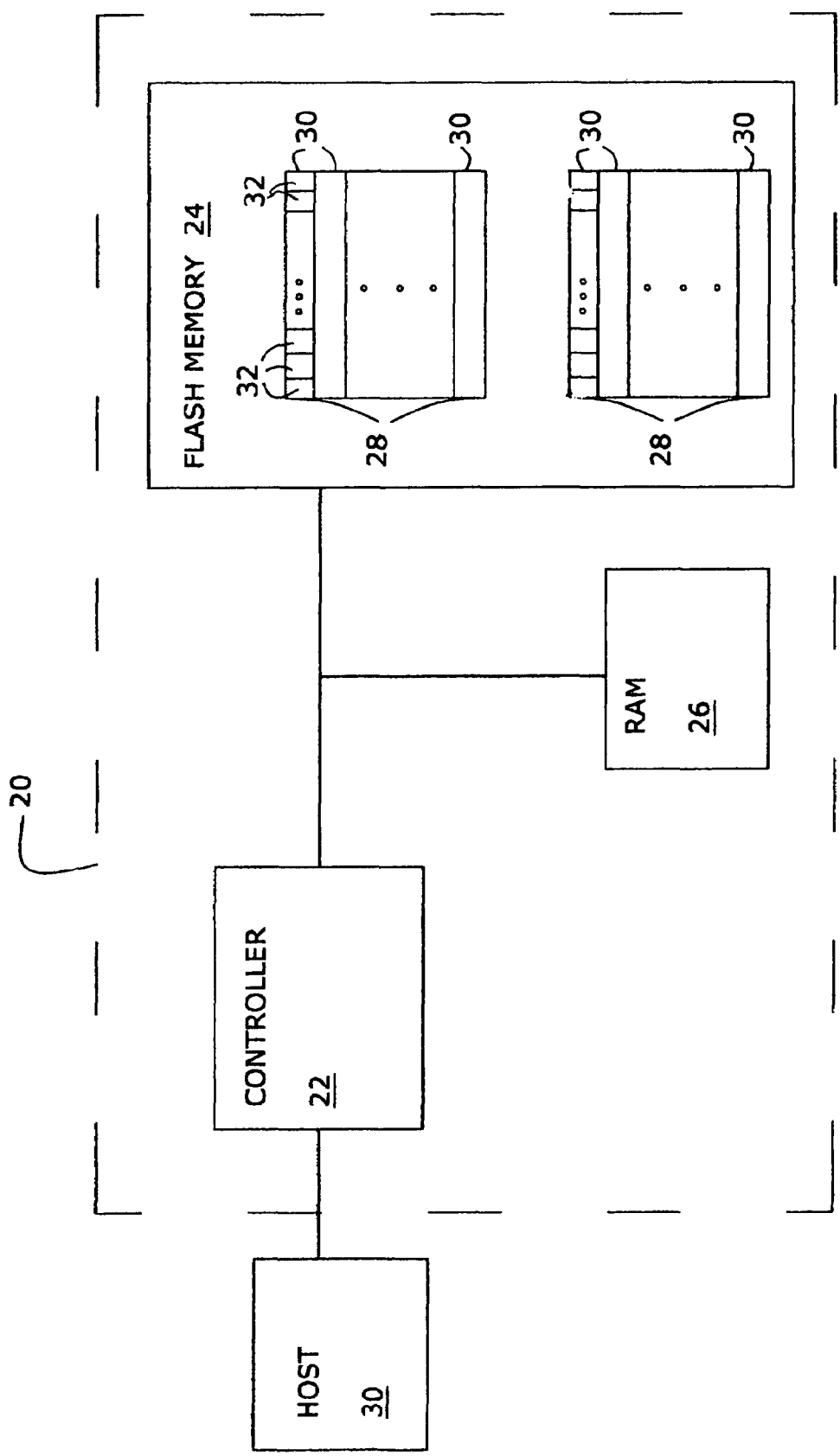
FIGS. 2 and 3 are high-level block diagrams of memory devices of the present invention.

FIG. 2 is a high-level block diagram of a flash memory device 20 of the present invention, coupled to a host 30. FIG. 2 is adapted from FIG. 1 of Ban, U.S. Pat. No. 5,404,485, which patent is incorporated by reference for all purposes as if fully set forth herein. Flash memory device 20 includes a flash memory 24, a controller 22 and a random access memory (RAM) 26. Flash memory 24 includes several erase blocks 28. Each erase block includes several pages 30. Each page 30 includes several cells 32. Controller 22, that corresponds to "flash control 14" of U.S. Pat. No. 5,404,485, manages flash memory 24, with the help of RAM 26, as described in U.S. Pat. No. 5,404,485. Controller 22 also supports refreshing of the data that are stored in flash memory 24 as described above.

Figure 3:
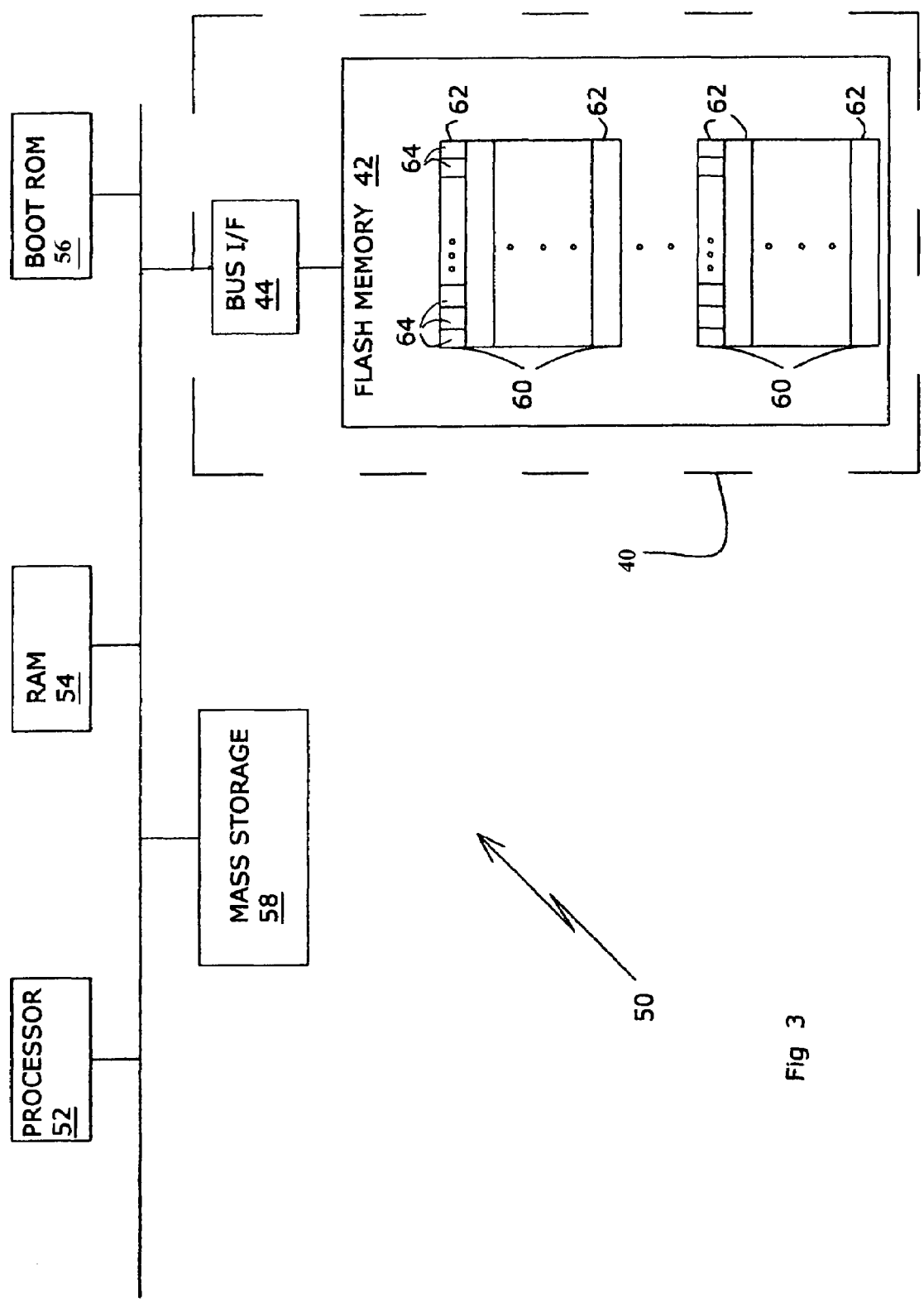

FIG. 3 is a high-level partial block diagram of an alternative data storage system 50 of the present invention. Data storage system 50 includes a processor 52 and four memory devices: a RAM 54, a boot ROM 56, a mass storage device (hard disk) 58 and a flash memory device 40, all communicating via a common bus 60. Like flash memory device 20, flash memory device 40 includes a flash memory 42 that, like flash memory 24, includes several erase blocks 60, each erase block 60 including several pages 62, each page 62 including several cells 64. Unlike flash memory device 20, flash memory device 40 lacks its own controller and RAM. Instead, processor 52 emulates controller 22 by executing a software driver that implements the methodology of U.S. Pat. No. 5,404,485 in the manner e.g. of the TrueFFS™ driver of M-Systems Flash Disk Pioneers Ltd. of Kfar Saba, Israel, and that also implements the data refreshing methodology of the present invention. Flash memory device also includes a bus interface 44 to enable processor 52 to communicate with flash memory 42.

While the invention has been described with respect to a limited number of embodiments, it will be appreciated that many variations, modifications and other applications of the invention may be made.

What is claimed is:

1. A method of managing a memory, comprising the steps of:
   (a) subsequent to a first storage of data in the memory, receiving new data not previously stored in the memory;
   (b) at a storage date: storing said new data in at least one cell of the memory; and
   (c) refreshing, out-of-place, said new data that are stored in said at least one cell, starting after a predetermined time interval has elapsed since said storage date;
   wherein a common said predetermined time interval is used for all said new data.

2. The method of claim 1, further comprising the steps of:
   (d) recording a timestamp indicative of said storage date; and
   (e) determining when to start said refreshing by comparing said timestamp to a clock of a system that includes the memory.

3. A memory device comprising:
   (a) at least one cell; and
   (b) a controller operative:
      (i) subsequent to a first storage of data in the memory device, to receive new data not previously stored in the memory device,
      (ii) at a storage date: to store said new data in said at least one cell, and
      (iii) to refresh said new data out-of-place, starting after a predetermined time interval has elapsed since said storage date;
   wherein said controller uses a common said predetermined time interval for all said new data.

4. A system for storing data, comprising:
   (a) a memory device that includes at least one cell; and
   (b) a processor operative:
      (i) subsequent to a first storage of data in the memory device, to receive new data not previously stored in the memory device,
      (ii) at a storage date: to store said new data in said at least one cell, and
      (iii) to refresh said new data out-of-place, starting after a predetermined time interval has elapsed since said storage date;
   wherein said processor uses a common said predetermined time interval for all said new data.

5. A method of managing a memory, comprising the steps of:
   (a) subsequent to a first storage of data in the memory, receiving new data not previously stored in the memory;
   (b) at a storage date: storing said new data in at least one cell of the memory; and
   (c) refreshing said new data that are stored in said at least one cell, starting after a predetermined time interval has elapsed since said storage date;
   wherein said refreshing is effected out-of-place.

6. A memory device comprising:
   (a) at least one cell; and
   (b) a controller operative:
      (i) subsequent to a first storage of data in the memory device, to receive new data not previously stored in the memory device,
      (ii) at a storage date: to store said new data in said at least one cell, and
      (iii) to refresh said new data starting after a predetermined time interval has elapsed since said storage date;
   wherein said refreshing is effected out-of-place.

7. A system for storing data, comprising:
   (a) a memory device that includes at least one cell; and
   (b) a processor operative:
      (i) subsequent to a first storage of data in the memory device, to receive new data not previously stored in the memory device,
      (ii) at a storage date: to store said new data in said at least one cell, and
      (iii) to refresh said new data starting after a predetermined time interval has elapsed since said storage date;
   wherein said refreshing is effected out of place.

* * * * *